(12) United States Patent
Onodera

(10) Patent No.: US 9,479,129 B2
(45) Date of Patent: Oct. 25, 2016

(54) AUDIO AMPLIFIER, AUDIO OUTPUT CIRCUIT, INTEGRATED CIRCUIT FOR AUDIO, ELECTRONIC DEVICE, AND METHOD FOR AMPLIFYING AUDIO SIGNAL

(71) Applicant: ROHM CO., LTD., Ukyo-Ku, Kyoto (JP)

(72) Inventor: Takeshi Onodera, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/704,261

(22) Filed: May 5, 2015

(65) Prior Publication Data

US 2015/0326192 A1 Nov. 12, 2015

(30) Foreign Application Priority Data

May 7, 2014 (JP) ................. 2014-096313

(51) Int. Cl.
*H03F 3/217* (2006.01)
*H03F 3/183* (2006.01)
*H03F 3/185* (2006.01)
*H03F 3/187* (2006.01)

(52) U.S. Cl.
CPC ............ *H03F 3/2173* (2013.01); *H03F 3/183* (2013.01); *H03F 3/185* (2013.01); *H03F 3/187* (2013.01); *H03F 3/217* (2013.01); *H03F 2200/03* (2013.01)

(58) Field of Classification Search
None
See application file for complete search history.

(56) References Cited

U.S. PATENT DOCUMENTS

| | | | | |
|---|---|---|---|---|
| 7,221,297 B2* | 5/2007 | Ohkuri | .................. | H03F 3/2175 330/10 |
| 2005/0156665 A1* | 7/2005 | Maejima | ................... | H03F 1/34 330/251 |
| 2006/0280314 A1* | 12/2006 | Okada | ..................... | H03F 3/217 381/71.1 |
| 2013/0187710 A1* | 7/2013 | Nagashima | ......... | H03F 3/45475 330/85 |
| 2014/0354352 A1* | 12/2014 | Noro | ....................... | H03F 3/217 330/10 |

FOREIGN PATENT DOCUMENTS

JP 2001223537 A 8/2001

* cited by examiner

*Primary Examiner* — Brenda Bernardi
(74) *Attorney, Agent, or Firm* — Cantor Colburn LLP

(57) ABSTRACT

An audio amplifier is disclosed. The audio amplifier for driving an electroacoustic transducer includes an H bridge circuit including a 1D-class amplifier connected to a (+) electrode terminal and a 2D-class amplifier connected to a (−) electrode terminal of the electroacoustic transducer; a pulse width modulator configured to receive an audio signal, generate a first and second pulse signal for each driving the 1D-class and the 2D-class amplifier, and adjust a phase difference between the first and the second pulse signal; a first driver driving the 1D-class amplifier depending on the first pulse signal; a second driver driving the 2D-class amplifier depending on the second pulse signal; a level detector detecting a level of the audio signal; a phase adjuster configured to set a phase difference between the first pulse signal and the second pulse signal of the pulse width modulator based on a detection result from the level detector.

16 Claims, 9 Drawing Sheets

AUDIO AMPLIFIER, AUDIO OUTPUT CIRCUIT, INTEGRATED CIRCUIT FOR AUDIO, ELECTRONIC DEVICE, AND METHOD FOR AMPLIFYING AUDIO SIGNAL

CROSS-REFERENCE TO RELATED APPLICATION

This application is based upon and claims the benefit of priority from Japanese Patent Application No. 2014-096313, filed on May 7, 2014, the entire contents of which are incorporated herein by reference.

TECHNICAL FIELD

The present disclosure relates to an audio amplifier for driving a speaker or a headphone.

BACKGROUND

An audio amplifier is used to amplify a weak audio signal to drive an electroacoustic transducer such as a speaker or a headphone. FIG. 1 is a circuit diagram illustrating a configuration of an audio amplifier 100r including a D-class amplifier. The audio amplifier 100r includes a pulse width modulator 110, a first driver 112, a second driver 114, a 1D-class amplifier 116, and a 2D-class amplifier 118. The pulse width modulator 110 pulse-width-modulates or pulse-density-modulates an audio signal S1. Pulse-modulated audio signals (hereafter, referred to as a "pulse signal") S2p and S2n are input to the first driver 112 and the second driver 114, respectively.

The load, an electroacoustic transducer 2, is bridge-transless (BTL)-connected to the 1D-class amplifier 116 and the 2D-class amplifier 118. The first filter 20 is inserted between a positive electrode terminal (+) of the electroacoustic transducer 2 and an output of the 1D-class amplifier 116, and the second filter 22 is inserted between a negative electrode terminal (−) of the electroacoustic transducer 2 and an output of the 2D-class amplifier 118. Each of the filters 20 (22) is a primary filter having a series inductor L1 (L2) and a shunt capacitor C1 (C2).

The first driver 112 complementarily switches a high side transistor and a low side transistor of the 1D-class amplifier 116 depending on the pulse signal S2p. Similarly, the second driver 114 complementarily switches a high side transistor and a low side transistor of the 2D-class amplifier 118 depending on the pulse signal S2n.

FIG. 2 is a waveform diagram when an audio output circuit 8r of FIG. 1 performs a differential operation. In the present disclosure, a vertical axis and a horizontal axis of waveform views or time charts are appropriately magnified or reduced to facilitate understanding and also simplified to facilitate understanding of each illustrated waveform.

Here, to facilitate understanding, a case in which the pulse signals S2p and S2n are generated by comparing a triangular wave and the audio signal S1 will be described. In a differential type D-class amplifier, the pulse signals S2p and S2n have an anti-phase. As a result, the output voltages $Vo_+$ and $Vo_-$ are differential signals, and an amplitude of the differential signal Vo ($=Vo_+-Vo_-$) is two times the source voltage $V_{DD}$ of the 1D-class amplifier 116 and the 2D-class amplifier 118.

In the differential type D-class amplifier, the first filter 20 and the second filter 22 serve as low band pass filters for removing a switching frequency of the differential signal Vo and reproducing the original audio signal S1.

Recently, instead of the differential operation of the D-class amplifier described above with reference to FIG. 2, a filterless operation is employed. FIG. 3 is a waveform diagram when the audio output circuit 8r performs a filterless operation. During the filterless operation, the pulse signal S2p is generated by comparing the audio signal S1 and a triangular wave, and the pulse signal S2n is generated by comparing a reversal signal #S1 of the audio signal S1 and a triangular wave. An amplitude of the differential signal Vo applied to the electroacoustic transducer 2 is ½ of the differential operation. This scheme does not require a low band pass filter for removing a switching frequency, and thus, it is called a filterless operation or a filterless scheme. However, in order to restrain unnecessary electromagnetic interference (EMI), a filter may not be removed, and in the filterless scheme, the first filter 20 and the second filter 22 serve as EMI removing filters.

Regarding the audio output circuit 8r of FIG. 1, the present inventors have reviewed sound quality indices such as (i) total harmonic distortion+noise (THD+N), (ii) inter-channel crosstalk and (iii) noise characteristics etc., and recognized the following technical problems.

Sound quality indices of the filterless type D-class amplifier are significantly affected by a chip layout. This means that the modification or change of a chip layout of an audio amplifier by a semiconductor manufacturer may degrade the sound quality indices. In this case, whenever a chip layout is modified or changed, verification needs to be performed to optimize sound quality indices, which may extend the development period and increase the design costs.

SUMMARY

The present disclosure provides embodiments of an audio amplifier having good sound quality.

According to one embodiment of the present disclosure, there is provided an audio amplifier for driving an electroacoustic transducer, including: an H bridge circuit including a 1D-class amplifier connected to a positive electrode terminal of the electroacoustic transducer and a 2D-class amplifier connected to a negative electrode terminal of the electroacoustic transducer; a pulse width modulator configured to receive an audio signal, generate a first pulse signal and a second pulse signal for driving the 1D-class amplifier and the 2D-class amplifier, respectively, and adjust a phase difference between the first pulse signal and the second pulse signal; a first driver configured to drive the 1D-class amplifier depending on the first pulse signal; a second driver configured to drive the 2D-class amplifier depending on the second pulse signal; a level detector configured to detect a level of the audio signal; and a phase adjuster configured to set a phase difference between the first pulse signal and the second pulse signal of the pulse width modulator based on a detection result from the level detector.

The present inventors recognized that sound quality indices are changed depending on the phase difference between the first pulse signal and the second pulse signal and that a phase difference which optimizes sound quality indices is varied in each level (sound volume) of an audio signal. Thus, high sound quality may be realized by implementing the function of adjusting a phase difference between two pulse signals depending on a level of an audio signal in a pulse modulator.

The pulse width modulator may be configured as a digital circuit. The pulse width modulator may include a first counter configured to generate a first carrier signal that changes at a predetermined period; and a second counter configured to generate a second carrier signal that changes at the predetermined period, wherein the pulse width modulator is configured to generate a first pulse signal and a second pulse signal based on the first carrier signal and the second carrier signal such that a phase difference between the first carrier signal and the second carrier signal is adjustable.

In this case, a phase difference may be accurately adjusted with high precision by adjusting the unit of the period of a clock signal input to the counter.

In some embodiments, the audio amplifier may further include a register that is rewritable from the outside, and configured to maintain a corresponding relationship between the detection result from the level detector and the phase difference.

Thus, since there is no need to mount a read only memory (ROM) in an audio amplifier, the cost may be reduced. In addition, for each application in which the audio amplifier is used, it is possible to set an optimal phase difference.

The level detector may be configured to divide a full scale of the audio signal into a plurality (N) of ranges (where N is an integer equal to or greater than 2) and determine where the audio signal is included among the ranges.

The phase adjuster may be configured to set the phase difference to zero when the audio signal is included in the smallest range.

Thus, a noise level in case of not inputting may be reduced as low as possible.

N may be 2 or 3. Thus, high sound quality may be realized, while restraining an increase in the circuit size.

The phase adjuster may be configured to change the phase difference during a period in which the outputs from the 1D-class amplifier and the 2D-class amplifier have the same level. Thus, noise resulting from a change in a phase difference may be restrained.

The phase adjuster may be configured to change the phase difference stepwise by a predetermined time width each time during a period in which the outputs from the 1D-class amplifier and the 2D-class amplifier have the same level.

Thus, since a phase difference $\Delta\phi$ may be gently changed, noise may be further reduced. The predetermined time width may be a pulse width resolving power of the first pulse signal and the second pulse signal.

The audio amplifier may be integrated in a single semiconductor substrate.

The term, "integrated" may include a case in which all the components of a circuit are formed on a semiconductor substrate or a case in which major components of a circuit are integrated, and some resistors, capacitors, or the like may be installed outside of the semiconductor substrate in order to adjust circuit constants.

By integrating a circuit into a single IC, a circuit area may be reduced and characteristics of a circuit element may also be uniformly maintained.

According to another embodiment of the present disclosure, there is provided an integrated circuit for multichannel audio for driving a plurality of electroacoustic transducers, including: a plurality of the audio amplifiers described above configured to correspond to the electroacoustic transducers. The audio amplifier of each channel is configured individually such that a phase difference is adjustable depending on a level of an audio signal of the corresponding channel.

In some embodiments, the integrated circuit may further include a digital signal processor installed in a previous stage of the pulse width modulator to perform at least one of equalizing processing, low band emphasizing processing, surround processing, stereo conversion, monaural conversion processing, frequency conversion processing, and level detection processing on the audio signal.

According to another embodiment of the present disclosure, there is provided an audio output circuit, including: an electroacoustic transducer; one of the audio amplifiers described above configured to drive the electroacoustic transducer.

According to another embodiment of the present disclosure, there is provided an electronic device, including: a sound source configured to generate audio data; and the audio amplifier described above.

Further, arbitrarily combining the foregoing components or converting the expression of the present disclosure among a method, an apparatus, and the like is also effective as an embodiment of the present disclosure.

DETAILED DESCRIPTION

Figure 1:
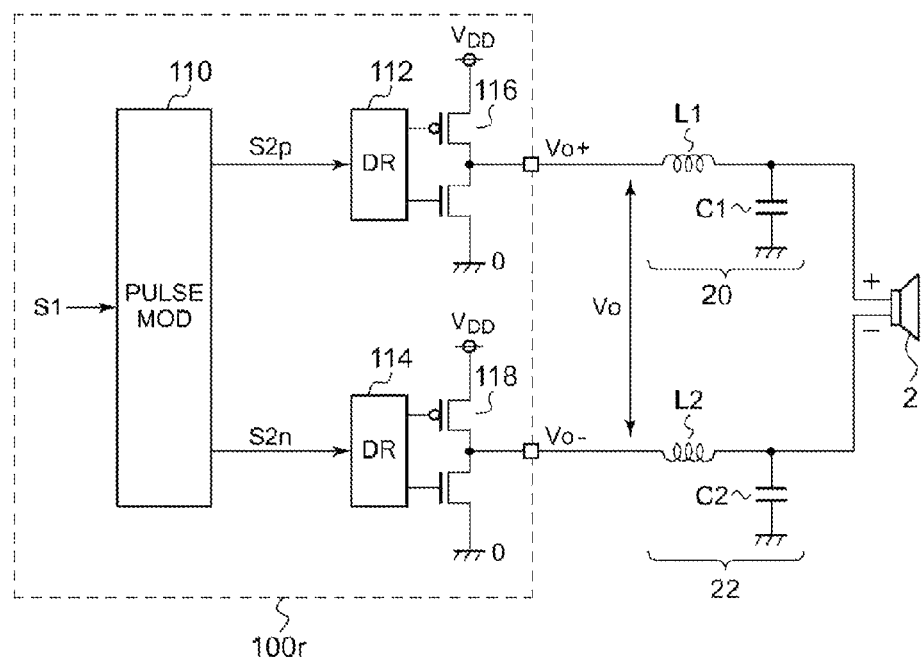
FIG. 1 is a circuit diagram illustrating a configuration of an audio amplifier including a D-class amplifier.
Figure 2:
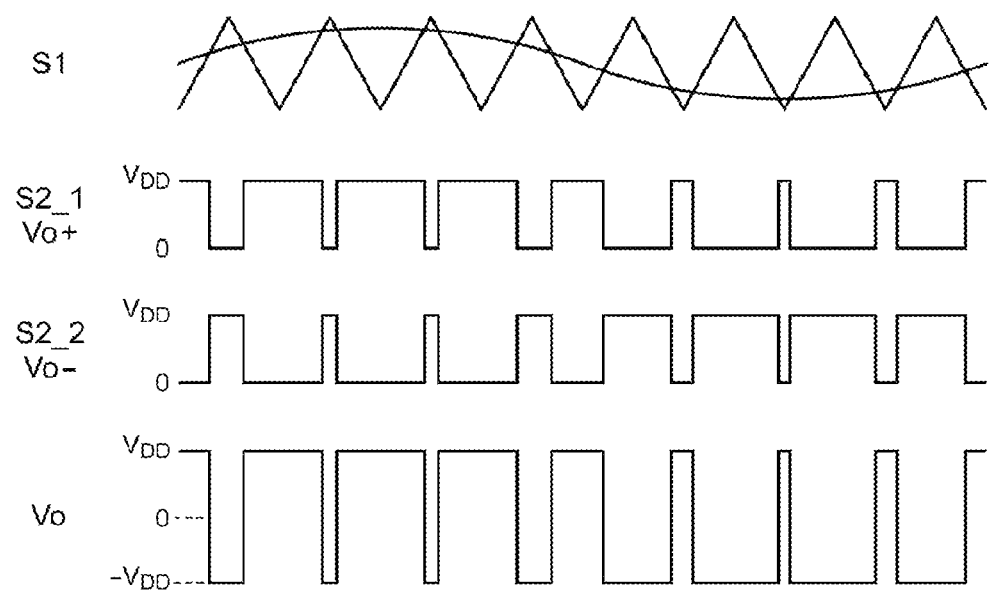
FIG. 2 is waveform diagram when an audio output circuit of FIG. 1 performs a differential operation.

Hereinafter, the embodiments of the present disclosure will be described with reference to the accompanying drawings. Like or equivalent components, members, and processes illustrated in each drawing are given like reference numerals and a repeated description thereof will be properly omitted. Also, the embodiments are merely illustrative, without limiting the present disclosure, and any feature or combination thereof described in the embodiments may not necessarily be essential to the present disclosure.

In the present disclosure, "a state in which a member A is connected to a member B" includes a case in which the member A and the member B are physically directly connected or even a case in which the member A and the member B are indirectly connected through another member that does not affect an electrical connection state thereof.

Similarly, "a state in which a member C is installed between a member A and a member B" also includes a case in which the member A and the member C or the member B and the member C are indirectly connected through another member that does not affect an electrical connection state, in addition to a case in which the member A and the member C or the member B and the member C are directly connected.

Figure 3:
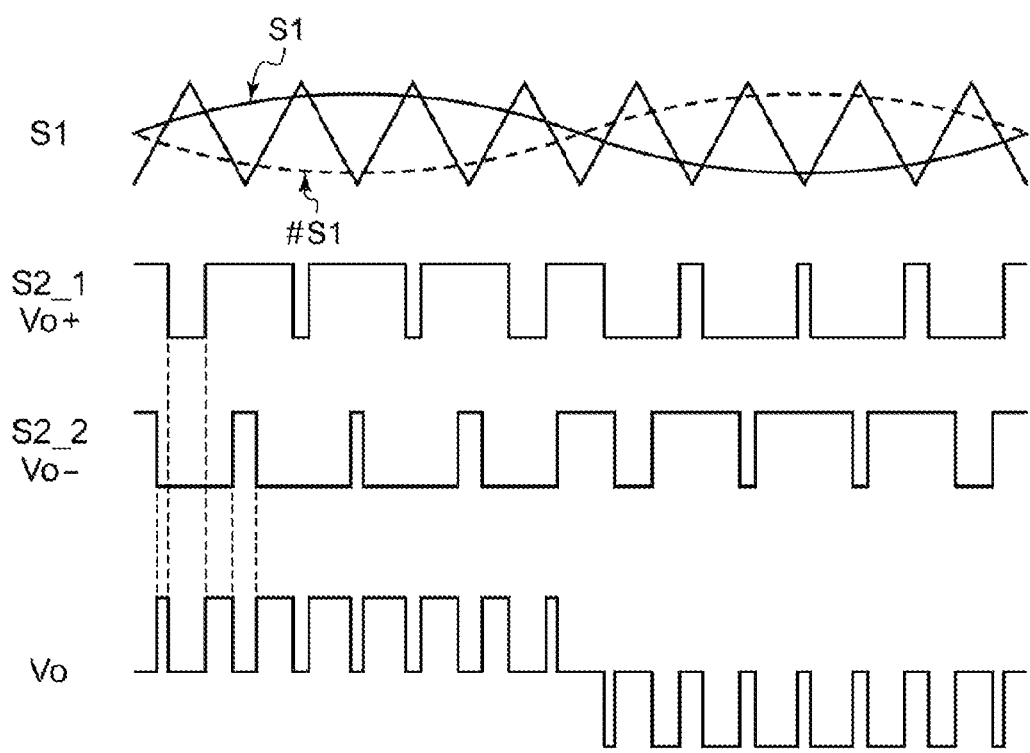
FIG. 3 is a waveform diagram when the audio output circuit performs a filterless operation.
Figure 4:
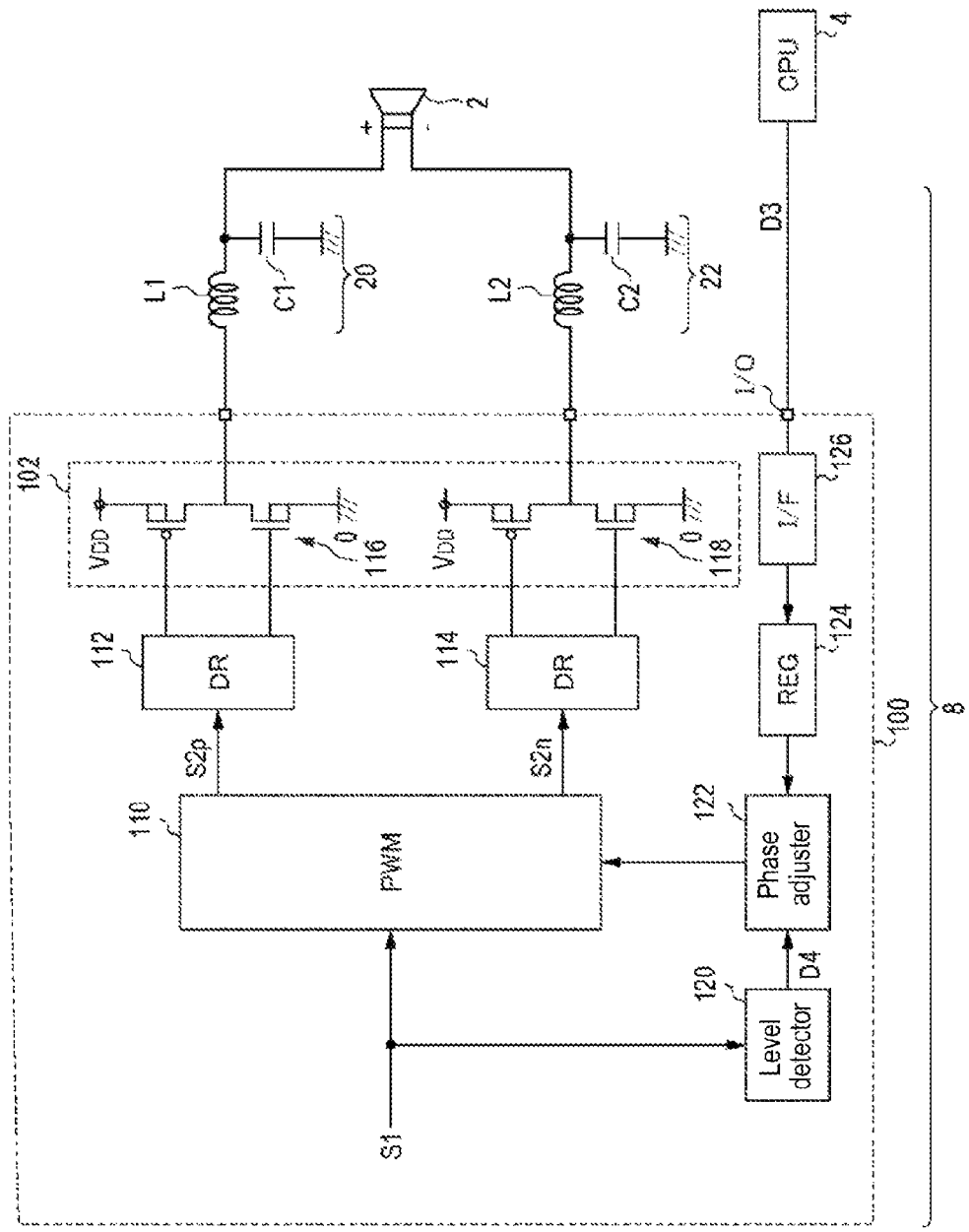
FIG. 4 is a circuit diagram of an audio output circuit including an audio amplifier according to an embodiment of the present disclosure.

FIG. 4 is a circuit diagram of an audio output circuit 8 including an audio amplifier 100 according to an embodiment of the present disclosure. The audio output circuit 8 drives an electroacoustic transducer 2. In addition to the audio amplifier 100 according to the embodiment of the present disclosure, the audio output circuit 8 includes a first filter 20 and a second filter 22 to constitute a filterless type D-class amplifier. The filterless scheme has been already described above with reference to FIG. 3. The first filter 20 and the second filter 22 are installed in order to primarily reduce unnecessary EMI.

The audio amplifier 100 is a functional integrated circuit (IC) integrated in a single semiconductor substrate, including output terminals OUTP and OUTN, and a data input/output terminal I/O.

The audio amplifier 100 includes an H bridge circuit 102, a first driver 112, a second driver 114, a pulse width modulator (PWM) 110, a level detector 120, a phase adjuster 122, a register 124 and an interface circuit 126.

The H bridge circuit 102 includes a 1D-class amplifier 116 and a 2D-class amplifier 118. The 1D-class amplifier 116 is connected to a positive electrode terminal (+) of the electroacoustic transducer 2 and the 2D-class amplifier 118 is connected to a negative electrode terminal (−) of the electroacoustic transducer 2.

The PWM 110 receives a digital audio signal S1 to generate a first pulse signal S2p and a second pulse signal S2n for driving the 1D-class amplifier 116 and the 2D-class amplifier 118 in a filterless manner, respectively. The PWM 110 is configured such that a phase difference between the first pulse signal S2p and the second pulse signal S2n is adjustable.

The first driver 112 drives the 1D-class amplifier 116 depending on the first pulse signal S2p. The second driver 1214 drives the 2D-class amplifier 118 depending on the second pulse signal S2n.

The level detector 120 detects a level of the digital audio signal S1. Further, the level detector 120 may detect an input level of the PWM 110, and the signal monitored by the level detector 120 is not limited to the audio signal S1 inputted to the PWM 110. For example, the level detector 120 may detect a level of an output signal from the H bridge circuit or may detect a level of a signal as a basis of the audio signal S1 in a circuit of a previous stage of the audio amplifier 100. Alternatively, the level detector 120 may detect a level of the audio signal S1 by using information such as a set value of a volume.

The phase adjuster 122 sets a phase difference $\Delta\phi$ between the first pulse signal S2p and the second pulse signal S2n from the PWM 110 based on a detection result of the level detector 120.

Figure 5:
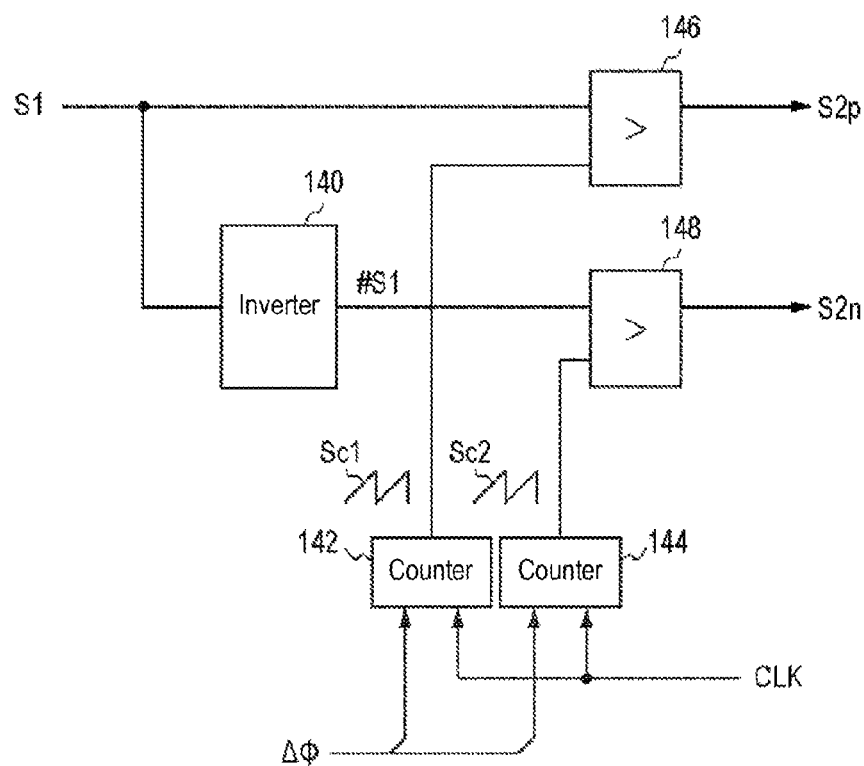
FIG. 5 is a block diagram illustrating a configuration example of a pulse width modulator.

FIG. 5 is a block diagram illustrating a configuration example of the PWM 110. The PWM 110 is configured as a digital circuit. The PWM 110 includes an inverter 140, a first counter 142, a second counter 144, a first comparator 146 and a second comparator 148. The first counter 142 counts a system clock CLK to generate a first carrier signal Sc1 of a triangular wave or a sawtooth wave (ramp wave) that changes at a predetermined period. The second counter 144 generates a second carrier signal Sc2 of a triangular wave or a sawtooth wave (ramp wave) that changes at a predetermined period.

The inverter 140 inverts the polarity of the audio signal S1. The first comparator 146 compares the first carrier signal Sc1 and the audio signal S1 to generate a first pulse signal S2p. The second comparator 148 compares the second carrier signal Sc2 and the reversed audio signal #S1 to generate a second pulse signal S2n.

The PWM 110 is configured such that a phase difference $\Delta\phi$ between the first carrier signal Sc1 and the second carrier signal Sc2 is adjustable. Specifically, a phase difference $\Delta\phi$ of the carrier signal is set to be adjusted in the first counter 142 and the second counter 144. An adjustment unit of the phase difference $\Delta\phi$ is identical to a period of the system clock CLK, and for example, when the system clock CLK is 100 MHz, the phase difference $\Delta\phi$ is understood as being adjusted in the units of 10 ns.

The register 124 maintains a corresponding relationship between the detection result from the level detector 120 and the phase difference $\Delta\phi$. The register 124 may retain a table indicating a relationship between the detected level (detection level) $S_{LV}$ and the phase difference $\Delta\phi$. Preferably, the register 124 is rewritable from an external CPU 4. The CPU 4 and an I/O terminal of the audio amplifier 100 are connected through an I$^2$C bus or the like. The CPU 4 generates data D3 indicating the phase difference $\Delta\phi$, and transmits the generated data D3 to the audio amplifier 100 through the I$^2$C bus. The interface circuit 126 receives the data D3 from the CPU 4 and writes the same in the register 124.

Figure 6:
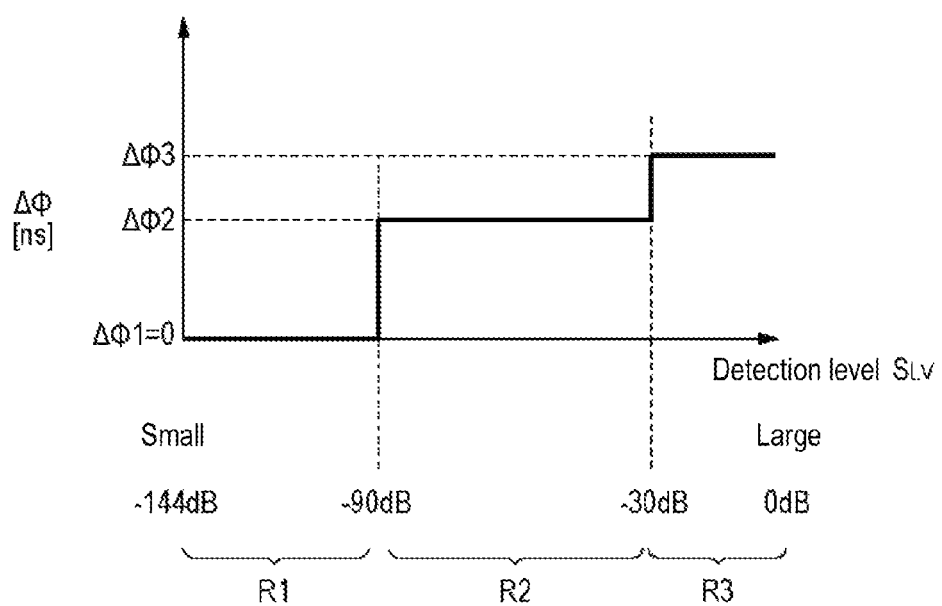
FIG. 6 is a diagram illustrating an example of a relationship between a detection level $S_{LV}$ and a phase difference $\Delta\phi$.

FIG. 6 is a diagram illustrating an example of the relationship between the detection level $S_{LV}$ and the phase difference $\Delta\phi$. For example, when a full scale of the audio signal S1 is divided by N, the level detector 120 generates data D4 that indicates in which range the current audio signal S1 is included in. In FIG. 6, the full scale is divided into three ranges of a range R1 smaller than −90 dB, a range R2 from −90 dB to −30 dB, and a range R3 greater than −30 dB, and phase differences $\Delta\phi1$, $\Delta\phi2$, and $\Delta\phi3$ may be set individually in each range.

The configuration of the audio amplifier 100 has been described above. Subsequently, an operation of the audio amplifier 100 will be described.

Figure 7A:
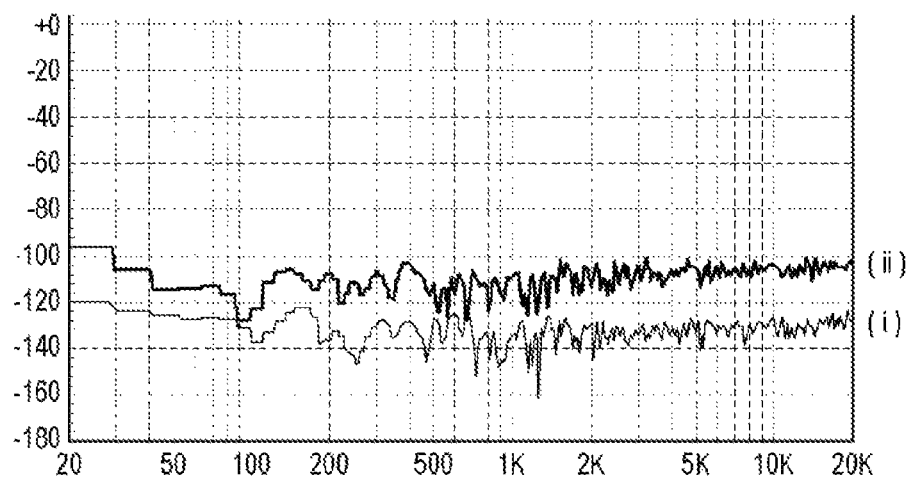
FIGS. 7A and 7B are diagrams illustrating measurement results of output spectrums of an audio amplifier according to an embodiment of the present disclosure.
Figure 7B:
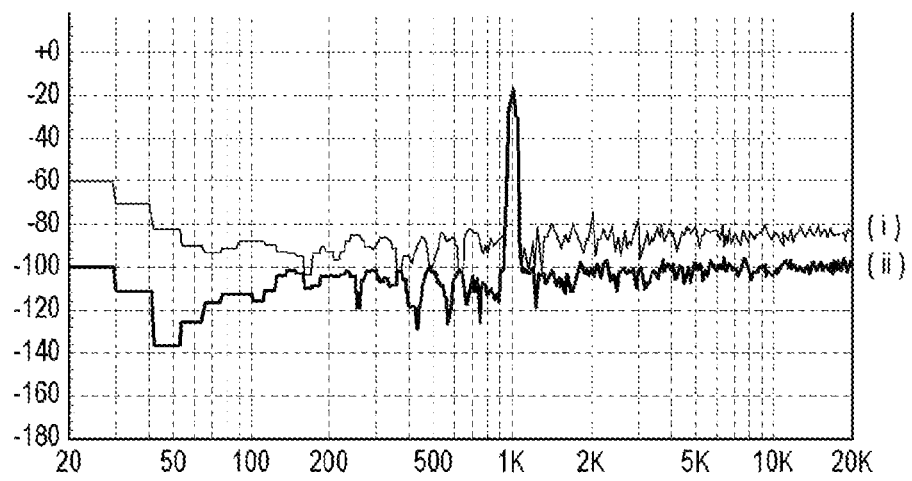

FIGS. 7A and 7B are diagrams illustrating measurement results of output spectrums of the audio amplifier 100 according to an embodiment of the present disclosure. FIG. 7A shows characteristics of the first range when no signal is input (−144 dB), and FIG. 7B shows characteristics of the second range when a small signal is output (−60 dB). FIGS. 7A and 7B (i) shows characteristics when the phase difference $\Delta\phi$ is zero and (ii) shows characteristics when the phase difference $\Delta\phi$ is 110 ns, respectively.

As illustrated in FIG. 7A, when no signal is input, a noise level is at the lowest when the phase difference $\Delta\phi$ is 0. Conversely, as illustrated in FIG. 7B, when a small signal is output, a noise level may be lowered by introducing a non-zero phase difference $\Delta\phi$. In the second range R2 and the third range R3, an optimal phase difference $\Delta\phi$ minimizing the noise level may vary depending on a chip layout of the audio amplifier 100.

As can be demonstrated from FIGS. 7A and 7B, when the phase difference $\Delta\phi$ is uniform without relying on the signal level of the audio signal S1, the noise level may be lowered at a certain signal level, while when the signal level is changed, the noise level is increased.

In this respect, in the audio amplifier 100 according to the embodiment of the present disclosure, the phase difference $\Delta\phi$ between the first pulse signal S2p and the second pulse signal S2n generated by the PWM 110 may be set depending on a signal level of the audio signal S1, whereby good noise characteristics can be realized regardless of a signal level of the audio signal S1.

When the phase difference Δϕ is changed depending on a change in the level of the audio signal S1, the following processing is preferably performed.

The phase adjuster 122 changes the phase difference Δϕ during a period in which the outputs Vo+ and Vo− of the 1D-class amplifier 116 and the 2D-class amplifier 118 have the same level. Thus, noise may be reduced by changing the phase difference Δϕ.

Further, the phase adjuster 122 changes the phase difference Δϕ by a minimum time width Δt each time during the period in which the outputs Vo+ and Vo− of the 1D-class amplifier 116 and the 2D-class amplifier 118 have the same level. As described above, the minimum time width Δt may be a period of the system clock CLK. Thus, a rapid change in the phase difference Δϕ can be prevented and noise can be further suppressed.

By dividing the level of the audio signal S1 into three ranges, noise characteristics sufficiently good in many applications can be realized, and also, a practical size that is allowed by the register 124 can be obtained. That is, both cost and performance may be compatible at high levels.

(Purpose)

Figure 8:
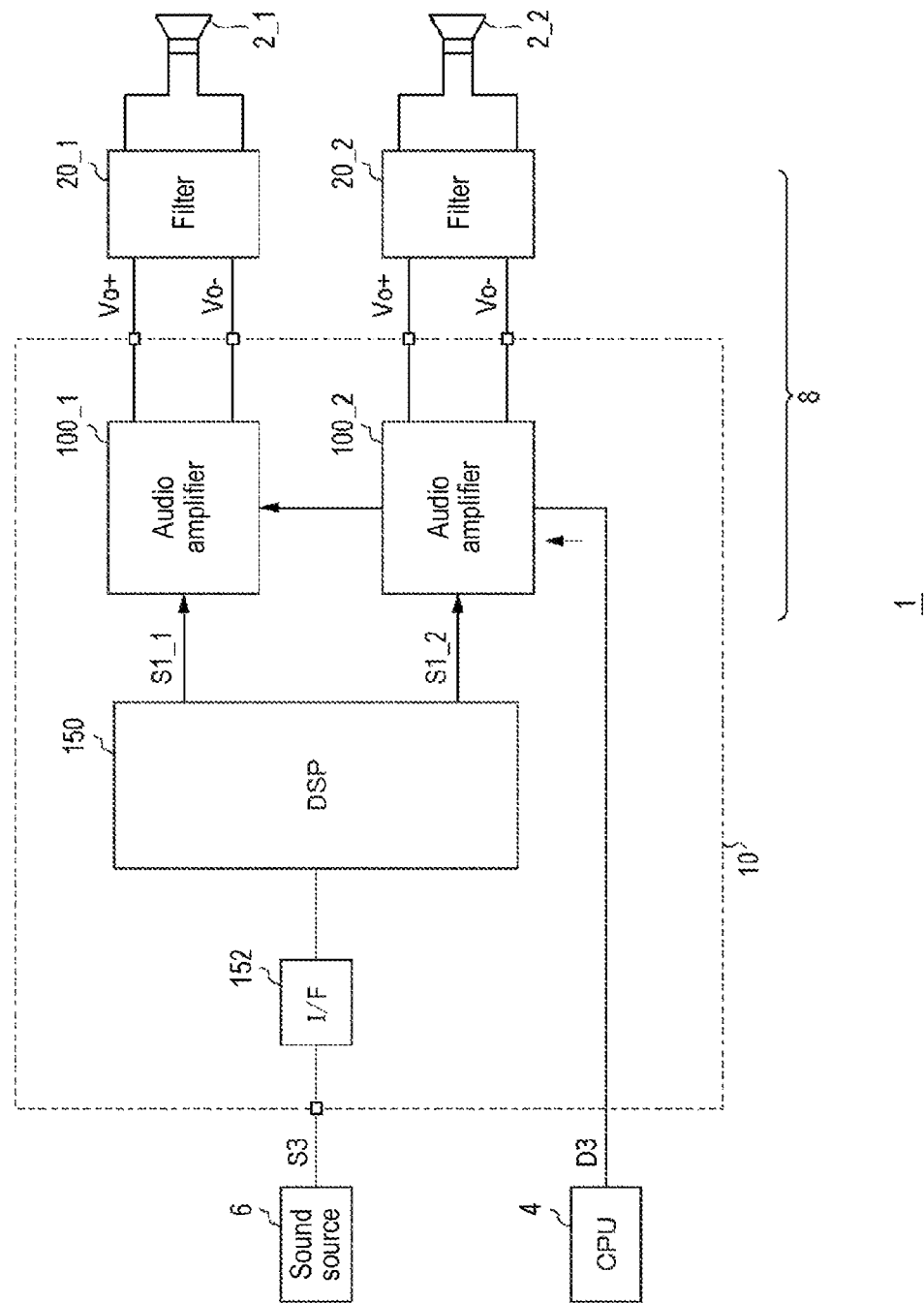
FIG. 8 is a block diagram of an electronic device having an IC for audio according to an embodiment of the present disclosure.

Next, the purpose of the audio amplifier 100 will be described. The audio amplifier 100 is integrated in an IC 10 for multichannel audio and incorporated in an electronic device 1. FIG. 8 is a block diagram of the electronic device 1 having the IC 10 for audio according to an embodiment of the present disclosure. Here, a case of two stereo-channels will be described, but the present disclosure may also be applied to a larger number of channels such as a 5.1 channel or the like.

The IC 10 for audio which includes a plurality of audio amplifiers 100_1 and 100_2, a digital signal processor (DSP) 150 and an audio interface circuit 152, is a functional IC integrated in a single semiconductor substrate. The audio amplifiers 100_1 and 100_2 drive corresponding electroacoustic transducers 2_1 and 2_2, respectively.

The audio interface circuit 152 receives a digital audio signal S3 from an external sound source 6. The DSP 150 is installed in a previous stage of the audio amplifiers 100_1 and 100_2, namely, in a previous stage of the PWM 110 of the audio amplifier 100 of each channel.

The DSP 150 decomposes the audio signal S3 from the sound source 6 into signals of each channel, performs various signal processing on the audio signals S1_1 and S1_2 of each channel, and outputs the same to the PWM 110 of each of the audio amplifiers 100_1 and 100_2 in the next stage. The signal processing performed by the DSP 150 includes equalizing processing, low band emphasizing processing, surround processing, stereo conversion, monaural conversion processing, frequency conversion processing, level detection processing, and the like.

In the IC 10 for the audio, the audio amplifier 100 of each channel CHi (i=1, 2) is configured to individually adjust the phase difference Δϕ depending on a detection level of the audio signal S1_i of the corresponding channel CHi.

The configuration of the IC 10 for the audio has been described above. According to the IC 10 for the audio, since the phase difference Δϕ can be optimized individually in each channel, crosstalk between channels can be significantly improved.

Figure 9A:
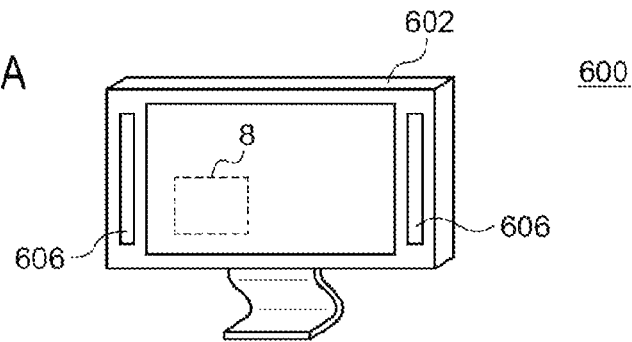
FIGS. 9A to 9C are diagrams illustrating the exterior of an electronic device.
Figure 9B:
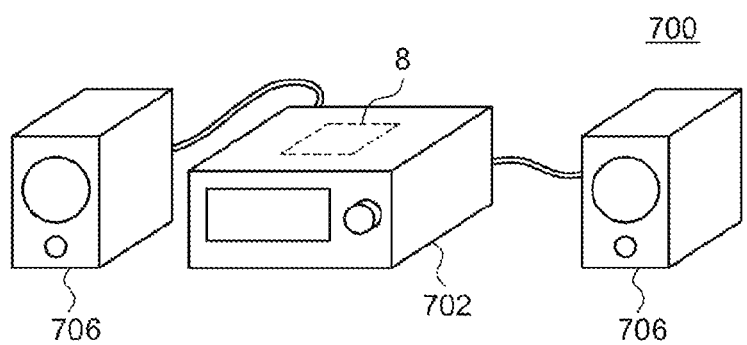
Figure 9C:
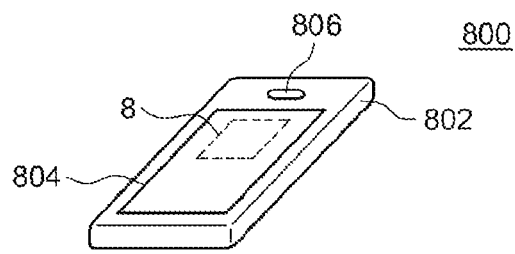

FIGS. 9A to 9C are diagrams illustrating the exterior of the electronic device 1. FIG. 9A is a diagram illustrating a display device 600 as an example of the electronic device 1. The display device 600 includes a case 602 and a speaker 606. The audio output circuit 8 is incorporated in the case to drive the speaker 606.

FIG. 9B is a diagram illustrating an audio component 700 as an example of the electronic device 1. The audio component 700 includes a case 702 and a speaker 706. The audio output circuit 8 is incorporated in the case 702 to drive the speaker 706.

FIG. 9C is a diagram illustrating a small information terminal 800 as an example of the electronic device 1. The small information terminal 800 may be a cellular phone, a personal handy-phone system (PHS), a personal digital assistant (PDA), a tablet personal computer (table PC), an audio player, or the like. The small information terminal 800 includes a case 802, a speaker 806, and a display 804. The audio output circuit 8 is incorporated in the case 802 to drive the speaker 806.

By employing the audio output circuit 8 in the electronic devices illustrated in FIGS. 9A to 9C, high sound quality can be realized. In addition, the audio output circuit 8 may also be used in an interphone, or the like.

The present disclosure has been described above based on the embodiment. It is to be understood by a person skilled in the art that this embodiment is illustrative, that various modifications may be made to the embodiment by combining the components and processing processes, and that such modifications are also within the scope of the present disclosure. Hereinafter, an example of these modifications will be described.

(First Modification)

In the embodiment, the filterless-type D-class amplifier has been described, but the present disclosure may also be applied to a differential type D-class amplifier.

(Second Modification)

In the embodiment, the case in which the level detector 120 divides the full scale of the audio signal S1 into three ranges has been described, but the present disclosure is not limited thereto. For example, the full scale may be divided into two ranges. In this case, a size of the register 124 may be reduced.

Conversely, in a case in which a circuit area is sufficient, N may be greater than or equal to 4. In this case, a reduction in the noise level may be achieved in each of the ranges.

(Third Modification)

The register 124 may retain information regarding a function corresponding to the phase difference Δϕ and the detection level $S_{LV}$. For example, when the phase difference Δϕ is expressed by an n-order polynomial expression of the detection level $S_{LV}$, and factors $a_0, \ldots a_n$ may be retained in the register 124.

$$\Delta\phi = a_0 + a_1 \cdot S_{LV} + a_2 \cdot S_{LV}^2 + \ldots + a_n \cdot S_{LV}^n$$

Also, the format of the function is not particularly limited to the above and a trigonometrical function or an exponential function may be used.

(Fourth Modification)

In the embodiment, the case in which the PWM 110 is configured as a digital circuit has been described, but the PWM 110 may be configured as an analog circuit. In this case, the inverter 140 of FIG. 5 may be configured as a reversing amplifier, the comparators 146 and 148 may be configured as voltage comparators, and the counters 142 and 144 may be configured as oscillators. Further, by allowing a phase of the oscillators to be adjustable, a phase difference between the pulse signals S2p and S2n may be adjusted.

(Fifth Modification)

In the embodiment, the phase difference Δϕ can be set in the register 124 from an external processor, but the present disclosure is not limited thereto. In a case in which the audio amplifier 100 includes a ROM, information regarding the phase difference Δφ may be stored in the ROM.

According to the present disclosure in some embodiments, it is possible to provide an audio amplifier with a good sound quality.

While certain embodiments have been described, these embodiments have been presented by way of example only, and are not intended to limit the scope of the present disclosure. Indeed, the novel methods and apparatuses described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. An audio amplifier for driving an electroacoustic transducer, comprising:
   an H bridge circuit including a 1D-class amplifier connected to a positive electrode terminal of the electroacoustic transducer and a 2D-class amplifier connected to a negative electrode terminal of the electroacoustic transducer;
   a pulse width modulator configured to receive an audio signal, generate a first pulse signal and a second pulse signal for driving the 1D-class amplifier and the 2D-class amplifier, respectively, and adjust a phase difference between the first pulse signal and the second pulse signal;
   a first driver configured to drive the 1D-class amplifier depending on the first pulse signal;
   a second driver configured to drive the 2D-class amplifier depending on the second pulse signal;
   a level detector configured to detect a level of the audio signal; and
   a phase adjuster configured to set the phase difference between the first pulse signal and the second pulse signal of the pulse width modulator based on a detection result from the level detector.

2. The audio amplifier of claim 1, wherein the pulse width modulator is configured as a digital circuit,
   the pulse width modulator comprises:
   a first counter configured to generate a first carrier signal that changes at a predetermined period; and
   a second counter configured to generate a second carrier signal that changes at the predetermined period,
   wherein the pulse width modulator is configured to generate the first pulse signal and the second pulse signal based on the first carrier signal and the second carrier signal such that a phase difference between the first carrier signal and the second carrier signal is adjustable.

3. The audio amplifier of claim 1, further comprising:
   a register that is rewritable from the outside, and configured to maintain a corresponding relationship between the detection result from the level detector and the phase difference.

4. The audio amplifier of claim 1, wherein the level detector is configured to divide a full scale of the audio signal into a plurality (N) of ranges (where N is an integer equal to or greater than 2) and determine where the audio signal is included among the ranges.

5. The audio amplifier of claim 4, wherein the phase adjuster is configured to set the phase difference to zero when the audio signal is included in the smallest range.

6. The audio amplifier of claim 4, wherein N is 2 or 3.

7. The audio amplifier of claim 1, wherein the phase adjuster is configured to change the phase difference during a period in which the first pulse signal and the second pulse signal have the same level.

8. The audio amplifier of claim 7, wherein the phase adjuster is configured to change the phase difference stepwise by a predetermined time width each time during the period in which the first pulse signal and the second pulse signal have the same level.

9. The audio amplifier of claim 8, wherein the time width is a pulse width resolving power of the first pulse signal and the second pulse signal.

10. The audio amplifier of claim 1, wherein the pulse width modulator is configured as an analog circuit.

11. The audio amplifier of claim 1, wherein the audio amplifier is integrated in a single semiconductor substrate.

12. An integrated circuit for multichannel audio for driving a plurality of electroacoustic transducers, comprising:
    the audio amplifier of claim 1, configured to correspond to the plurality of electroacoustic transducers,
    wherein the audio amplifier of each channel is configured individually such that a phase difference is adjustable depending on a level of an audio signal of the corresponding channel.

13. The integrated circuit of claim 12, further comprising:
    a digital signal processor installed in a previous stage of the pulse width modulator to perform at least one of equalizing processing, low band emphasizing processing, surround processing, stereo conversion, monaural conversion processing, frequency conversion processing, and level detection processing on the audio signal.

14. An audio output circuit, comprising:
    an electroacoustic transducer;
    the audio amplifier of claim 1, configured to drive the electroacoustic transducer;
    a first filter installed between a positive electrode terminal of the electroacoustic transducer and the 1D-class amplifier of the audio amplifier; and
    a second filter installed between the positive electrode terminal of the electroacoustic transducer and the 1D-class amplifier of the audio amplifier.

15. An electronic device, comprising:
    the audio output circuit of claim 14; and
    a sound source configured to generate audio data.

16. A method of amplifying an audio signal to drive an electroacoustic transducer, comprising:
    arranging an H bridge circuit including a 1D-class amplifier connected to a positive electrode terminal of the electroacoustic transducer and a 2D-class amplifier connected to a negative electrode terminal of the electroacoustic transducer;
    generating a first pulse signal and a second pulse signal for driving the 1D-class amplifier and the 2D-class amplifier based on an audio signal;
    driving the 1D-class amplifier depending on the first pulse signal, and driving the 2D-class amplifier depending on the second pulse signal;
    detecting a level of the audio signal; and
    setting a phase difference between the first pulse signal and the second pulse signal based on a detection level result of the audio signal.

* * * * *